(12) United States Patent
Kawaguchi et al.

(10) Patent No.: US 8,555,458 B2
(45) Date of Patent: Oct. 15, 2013

(54) CLEANING SPONGE ROLLER

(75) Inventors: Tadashi Kawaguchi, Koga (JP); Hidehiko Tsukada, Koga (JP); Takashi Yamanaka, Koga (JP)

(73) Assignee: Aion Co., Ltd, Osaka (JP)

( * ) Notice: Subject to any disclaimer, the term of this patent is extended or adjusted under 35 U.S.C. 154(b) by 170 days.

(21) Appl. No.: 13/000,806

(22) PCT Filed: Jun. 22, 2009

(86) PCT No.: PCT/JP2009/061347
§ 371 (c)(1),
(2), (4) Date: Mar. 7, 2011

(87) PCT Pub. No.: WO2010/001761
PCT Pub. Date: Jan. 7, 2010

(65) Prior Publication Data
US 2011/0265279 A1    Nov. 3, 2011

(30) Foreign Application Priority Data

Jun. 30, 2008  (JP) .................. 2008-171212

(51) Int. Cl.
*H01L 21/304* (2006.01)
*B08B 1/04* (2006.01)

(52) U.S. Cl.
USPC ........... 15/256.52; 15/88.3; 15/256.5; 492/30

(58) Field of Classification Search
USPC ........... 15/88.2, 88.3, 102, 77, 256.5, 256.52; 492/28, 30, 33, 34, 36, 45, 48; D32/40
See application file for complete search history.

(56) References Cited

U.S. PATENT DOCUMENTS

2002/0100132 A1* 8/2002 McMullen et al. ............. 15/102

FOREIGN PATENT DOCUMENTS

| EP | 0937509 | 8/1999 |
| JP | 2000-246187 | 9/2000 |
| JP | 3378015 | 2/2003 |
| JP | 2003-190886 | 7/2003 |
| JP | 2008-119621 | 5/2008 |

OTHER PUBLICATIONS

Computer generated English translation of JP 2008-119621, Kumata, May 2008.*
English translation of JP 2008-119621 A, Kamata, May 2008.*

* cited by examiner

*Primary Examiner* — Laura C Guidotti
(74) *Attorney, Agent, or Firm* — Day Pitney LLP

(57) ABSTRACT

A cleaning sponge roller 1 is made of a polyvinyl acetal porous material having elasticity in a wet state, and includes a roller body 3 in an approximate cylinder form, and a plurality of protrusions 5 formed integrally on an outer peripheral surface 3*a* of the roller body 3, and rotates the multiple protrusions 5 to make contact with a surface to be cleaned so as to clean the surface. Outer surfaces of the protrusions 5 respectively have a top outer surface 5*a* (interior exposed surface) making contact with the surface to be cleaned while cleaning in a state where internal structures of the protrusions 5 are exposed.

11 Claims, 7 Drawing Sheets

CLEANING SPONGE ROLLER

CROSS REFERENCE TO RELATED APPLICATION

This application is the National Phase of PCT/JP2009/061347 filed on Jun. 22, 2009 which claims priority from JP2008-171212 filed on Jun. 30, 2008, the contents of which are incorporated herein by reference.

TECHNICAL FIELD

The present invention relates to a cleaning sponge roller mainly used in scrub cleaning in a cleaning step of a manufacturing process of electronics components, such as semiconductor electronic device wafer, silicon wafer, hard disk, and the like, for example.

BACKGROUND ART

In recent years, there has been remarkable improvement in accuracy in various components in the electronic industry, and accordingly, there has been increasing demand for capability of cleaning the manufacturing environment. Especially, since chemical contamination and adhered particles on the surface of components greatly effects the yield and reliability of operation of products, significance of the cleaning step in the manufacturing process is great, and various cleaning methods are therefore being developed.

For example, as a method of cleaning a surface of an object to be cleaned (surface to be cleaned) such as semiconductor electronic device wafer, silicon wafer, hard disk, or the like, scrub cleaning using a sponge roller, which includes an elastic, cylindrical roller fixed to the outer circumference of a rotary axis where the roller is made of, for example, a polyvinyl acetal porous material, and multiple protrusions formed integrally on the outer peripheral surface of the roller body, is well known. Scrub cleaning means to brush and clean by bringing the multiple protrusions of the outer circumference portion of the roller body into contact with a surface to be cleaned, and rotating a sponge roller via the rotary axis while supplying water or other cleaning liquid to the contact portions thereof.

PRIOR ART DOCUMENTS

Patent Documents

Patent Document 1: Patent Publication No. 3378015

SUMMARY OF THE INVENTION

Problem to be Solved by the Invention

Generally, when using a sponge roller first, cleaning capability of the sponge roller itself (especially area of the outer surface of the protrusions to be in contact with a surface to be cleaned) needs to be increased, and therefore cleaning of the sponge roller is carried out before scrub cleaning of the surface to be cleaned. More specifically, the sponge roller is attached to a cleaning device, and scrub cleaning is carried out on a dummy surface to be cleaned. Moreover, in the scrub cleaning, relatively small particles or relatively large particles of an abrasive or the like removed from the surface to be cleaned flow along with the cleaning liquid.

However, if the outer surface of the protrusions is covered by an outer skin layer of a lower porosity than the inner structure of the protrusions, open area ratio of the surface of the outer skin layer decreases, making it difficult to flow wash water. As a result, it takes time to clean the sponge roller itself, and start-up time (break-in time) increases.

Moreover, in the surface of the outer skin layer with a low open area ratio, when particles with a smaller diameter than the openings in the outer skin layer penetrate inside of the protrusions (inside of the outer skin layer) from the openings of the surface of the outer skin layer, those particles are easily captured within the protrusions, leading to reduction in life cycle of products.

Furthermore, in the surface of the outer skin layer with a low open area ratio, abundance ratio (area ratio) of the material of the sponge roller is high, and thus relatively large particles are easily captured while cleaning. As a result, there is a possibility of the caught particles making contact with the surface to be cleaned and damaging it.

Therefore, an objective of the present invention is to provide a cleaning sponge roller capable of reducing start-up time of a cleaning process, improving life cycle of products, and reducing damage of a surface to be cleaned.

Means of Solving the Problem

In order to achieve the aforementioned objective, a cleaning sponge roller according to the present invention is made of a polyvinyl acetal porous material having elasticity in a wet state and includes a roller body in an approximate cylinder form, and a plurality of protrusions formed integrally on an outer peripheral surface of the roller body, and rotates the protrusions to make contact with a surface to be cleaned so as to clean the surface. Outer surfaces of the protrusions respectively have an interior exposed surface making contact with the surface to be cleaned while cleaning in a state where internal structures of the protrusions are exposed. Note that the outer surfaces of the protrusions mean all surfaces of the protrusions including top outer surfaces and outer peripheral surfaces, and the interior exposed surface is formed in at least a part of all the surfaces.

The open area ratio of the interior exposed surface is preferably 50% or greater, more preferably 60% or greater.

The interior exposed surface should at least include a region of the tops of the protrusions in the front of the rotative direction, and the top outer surfaces of the protrusions may be formed as interior exposed surfaces. Moreover, each of the protrusions may have a cylindrical shape with a larger diameter than distance from the outer peripheral surface to the top outer surface.

Furthermore, total area of the top outer surfaces of all of the protrusions is preferably 50% or less than area of a phantom contact outer periphery surface passing over the outer edge of the respective protrusions. Even further, in the case where the surface to be cleaned is a 300 mm-wide wafer, number of protrusions is preferably 100 or greater.

Here, generally, in the case of a polyvinyl acetal porous material in which the internal structure is covered by an outer skin layer, the outer skin layer has a lower porosity than the internal structure, and the surface of the outer skin layer has a lower open area ratio than in the case where the internal structure is exposed. As a result, it is more difficult for cleaning water to flow to the outer skin layer than the internal structure.

Regarding this problem, with the aforementioned configuration, the outer surfaces of the protrusions are interior exposed surfaces exposing the internal structures of the protrusions having a higher porosity (open area ratio) than the outer skin layer, and these top outer surfaces make contact with the surface to be cleaned at the time of cleaning. Therefore, when using the sponge roller first, for the purpose of heightening the cleaning capability of the sponge roller itself (especially area of the outer surfaces of the protrusions to be in contact with the surface to be cleaned), time (start-up time and break-in time) for scrub cleaning of a dummy surface to be cleaned may be reduced.

Moreover, even when particles with a smaller diameter than the openings in the internal exposed surfaces penetrate inside of the protrusions from the openings of the internal exposed surface due to a relatively high open area ratio, those particles may not be easily captured within the protrusions, thereby improving the life cycle of products.

Furthermore, the internal exposed surface has a relatively high open area ratio, and the material (polyvinyl acetal porous material) of the cleaning sponge roller has a low abundance ratio (area ratio). Therefore, particles with a relatively large diameter are not easily captured while cleaning, and damage to the surface to be cleaned by the captured particles may be inhibited.

The outer peripheral surface of the roller body may be covered by an outer skin layer with a lower open area ratio than that of the interior exposed surface of the protrusions.

With the aforementioned configuration, since the outer peripheral surface of the roller body is covered by an outer skin layer with a low open area ratio, it is easy for the cleaning liquid flowing from inside of the cleaning sponge roller outward to flow out from the interior exposed surface of the protrusions than from the outer peripheral surface of the roller body. As a result, reduction in break-in time, improvement in life cycle of products, and control of damage to a surface to be cleaned may be further achieved.

The outer peripheral surfaces of the protrusions may be covered by an outer skin layer with a lower open area ratio than that of the interior exposed surface.

With the aforementioned configuration, since the outer peripheral surfaces of the protrusions are covered by an outer skin layer with a low open area ratio, it is easy for the cleaning liquid flowing from inside of the cleaning sponge roller outward via the protrusions to flow out from the interior exposed surface than from the outer peripheral surfaces of the protrusions. As a result, reduction in break-in time, improvement in life cycle of products, and control of damage to a surface to be cleaned may be further achieved.

The interior exposed surfaces may slant toward the outer peripheral surface of the roller body on the front side of the protrusions in the rotative direction.

With the aforementioned configuration, since it is easy for the interior exposed surface to make contact with the surface to be cleaned, reduction in break-in time, improvement in life cycle of products, and control of damage to a surface to be cleaned may be further achieved.

Result of Invention

According to the cleaning sponge roller according to the present invention, reduction in start-up time of a cleaning process, improvement in life cycle of products, and reduction in damage of a surface to be cleaned may be achieved.

BEST MODE FOR CARRYING OUT THE INVENTION

A cleaning sponge roller (simply referred to as sponge roller hereinafter) according to an embodiment of the present invention will be described based on the drawings.

Figure 1:
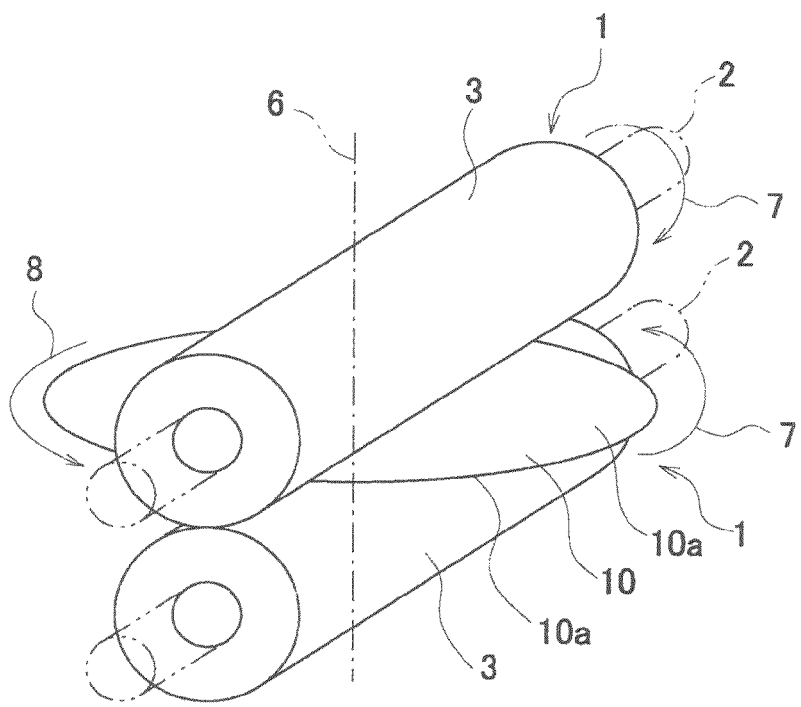
FIG. 1 is a perspective view illustrative of cleaning surfaces to be cleaned using a sponge roller according to an embodiment of the present invention.
Figure 2:
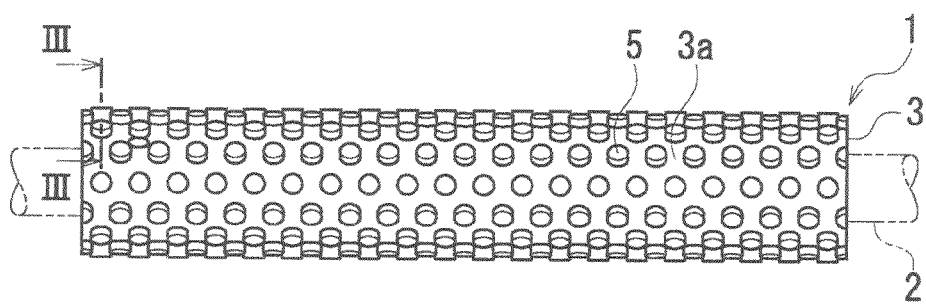
FIG. 2 is a side view of the sponge roller of FIG. 1.
Figure 3:
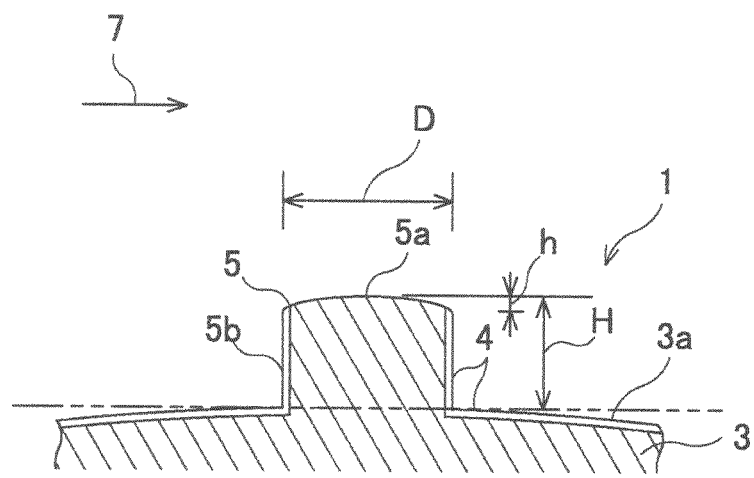
FIG. 3 is a cross-sectional view of a protrusion of the sponge roller of FIG. 2 cut along a line III-III.
Figure 4:
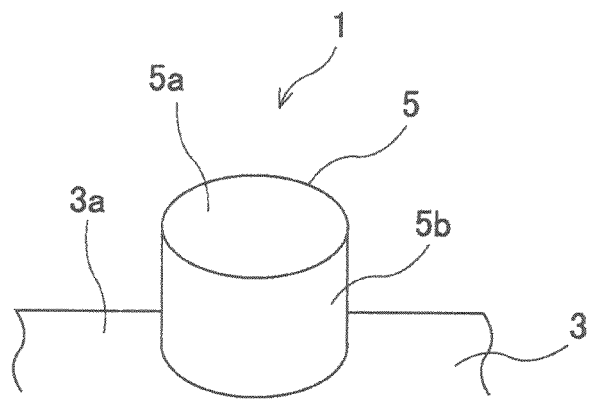
FIG. 4 is an exterior perspective view of the protrusion of FIG. 3.
Figure 5:
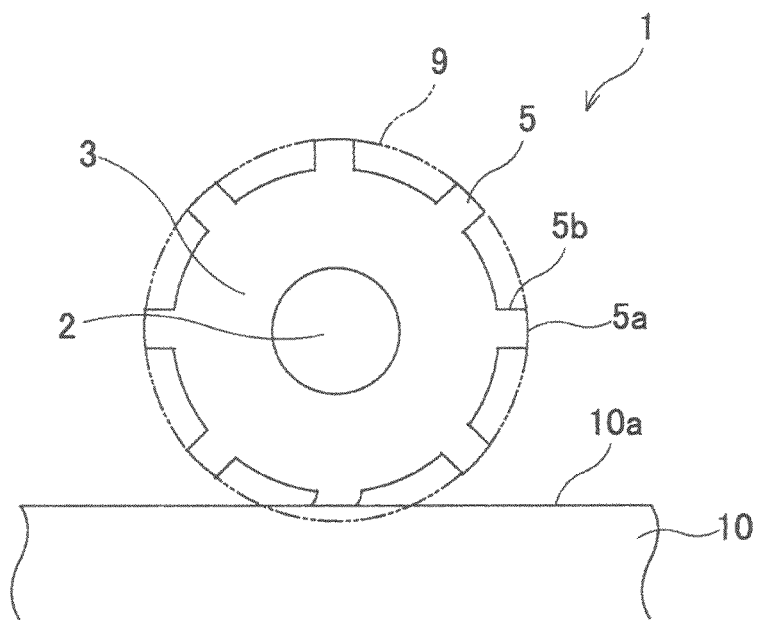
FIG. 5 is a side view schematically illustrative of the sponge roller of FIG. 2 in use.
Figure 6:
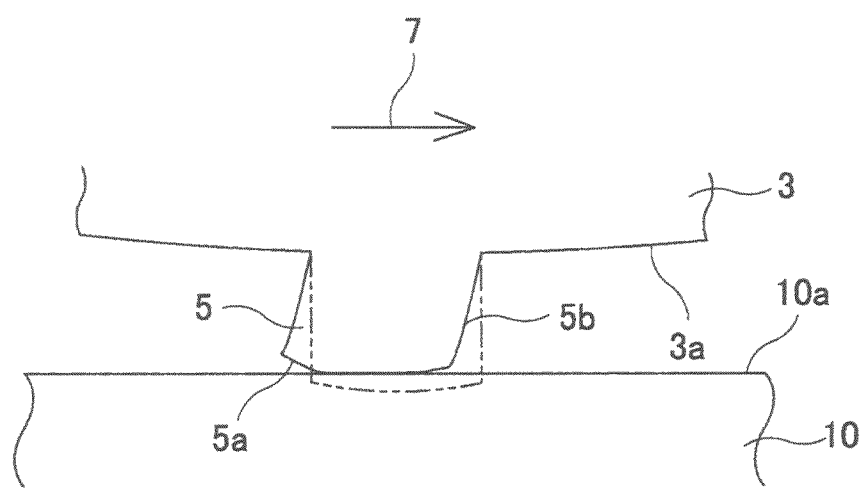
FIG. 6 is an enlarged view of principal parts of FIG. 5.
Figure 7:
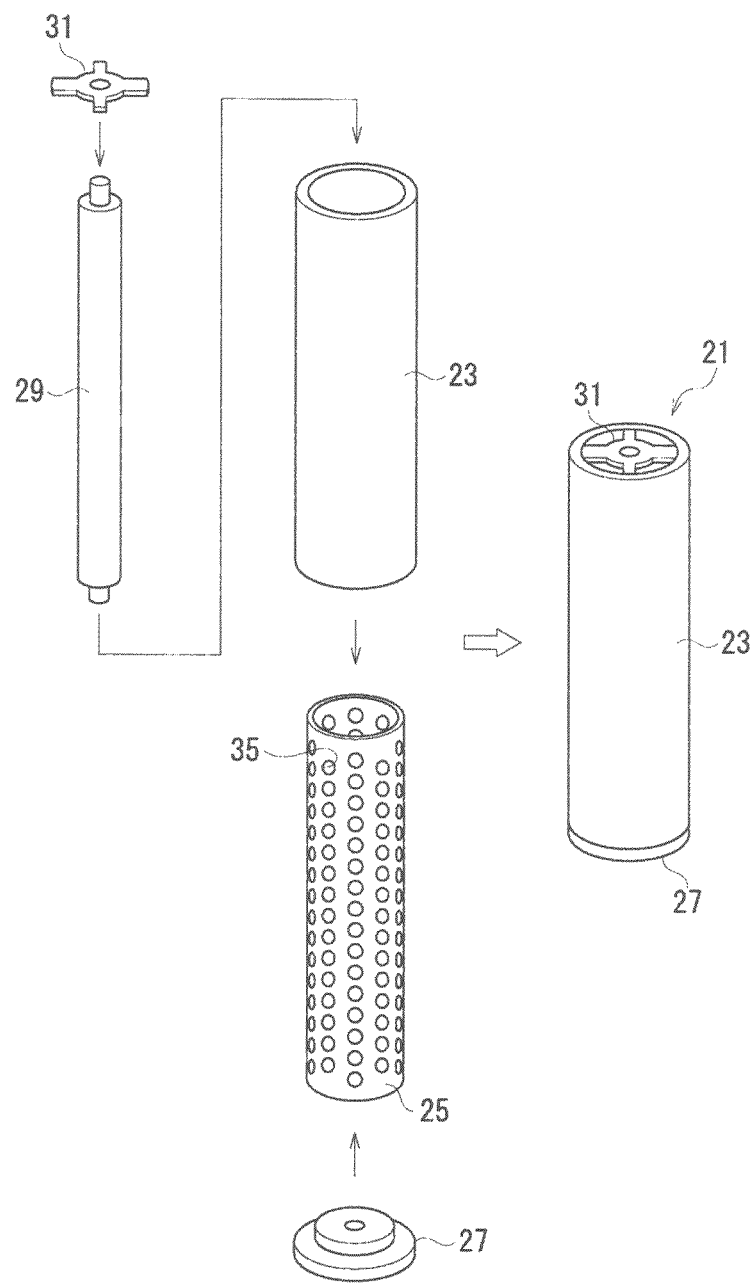
FIG. 7 is a perspective view illustrative of a mold for shaping the sponge roller of FIG. 2.
Figure 8:
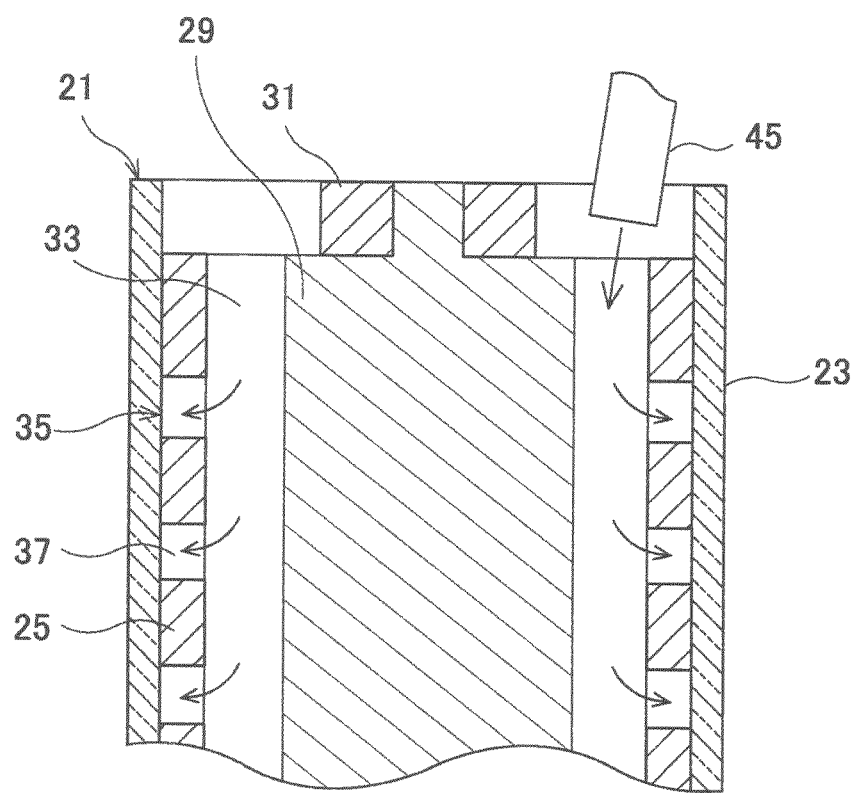
FIG. 8 a cross-sectional view illustrative of a method of manufacturing the sponge roller of FIG. 2.

FIG. 1 is a perspective view illustrative of cleaning surfaces to be cleaned using the sponge roller according to this embodiment of the present invention. FIG. 2 is a side view of the sponge roller of FIG. 1. FIG. 3 is a cross-sectional view of a protrusion of the sponge roller of FIG. 2 cut along a line III-III. FIG. 4 is an exterior perspective view of the protrusion of FIG. 3. FIG. 5 is a side view schematically illustrative of the sponge roller of FIG. 2 in use. FIG. 6 is an enlarged view of principal parts of FIG. 5. FIG. 7 is a perspective view illustrative of a mold for shaping the sponge roller of FIG. 2. FIG. 8 is a cross-sectional view illustrative of a method of manufacturing the sponge roller of FIG. 2. Note that illustration of protrusions is omitted in FIG. 1.

As shown in FIG. 1 to FIG. 6, a target object to be cleaned 10 subject to scrub cleaning is a thin disc wafer, and surfaces to be cleaned 10a are the top surface and the rear surface of the object to be cleaned 10.

Each of paired upper and lower sponge rollers 1 for scrub cleaning has an approximately cylindrical roller body 3, and multiple protrusions 5 formed integrally on an outer peripheral surface 3a of the roller body 3. Each of the protrusions 5 has a top outer surface 5a and an outer peripheral surface 5b. An approximately columnar rotary axis 2 made of a hard material such as metal or plastic is attached to each of the roller bodies 3. Note that the form of the protrusions 5 is not limited to a cylindrical shape.

Scrub cleaning is carried out by arranging the upper and lower rotary axes 2 roughly parallel at a predetermined distance apart, sandwiching the object to be cleaned 10 between the upper and lower roller bodies 3 (between the protrusions 5 of the upper roller body 3 and protrusions 5 of the lower roller body 3) in a state where the surfaces to be cleaned 10a are arranged roughly parallel to the rotary axes 2, supplying a cleaning liquid onto the surfaces to be cleaned 10a, rotating (rotative direction is indicated by arrows 7) the respective rotary axes 2, and rotating (rotative direction indicated by arrow 8) the surfaces to be cleaned 10a around a rotary axis 6, which is approximately orthogonal to the rotary axes 2. Namely, the surfaces to be cleaned 10a are scrub-cleaned by the top outer surfaces 5a of the protrusions 5 on the roller bodies 3 rotating and making contact with the rotating surfaces to be cleaned 10a.

Note that arrangement of the paired sponge rollers 1 are not limited to the aforementioned upper and lower positions; and for example, the paired sponge rollers 1 may be arranged in various modes, such as erecting and placing them on the left and right, or arranging them in an oblique direction. Moreover, the rotary axis 6 of the object to be cleaned 10 should be set to be approximately orthogonal to the rotary axes 2 of the sponge rollers 1; for example, when the paired sponge rollers 1 and the rotary axes 2 thereof are erected in an approximately vertical direction, the rotary axis 6 of the object to be cleaned 10 should be arranged in an approximately horizontal direction.

The sponge rollers 1 (the roller body 3 and the protrusions 5) are made of a polyvinyl acetal porous material (PVAt porous material), which is elastic in a moist state. The PVAt porous material is hard in a dry condition and soft in a wet condition. Moreover, the PVAt porous material has excellent water-absorbing, water-holding, and wear-resistance properties, and exhibits favorable flexibility and moderate rebound resilience when wet. The rotary axes 2 are inserted through inside of the roller bodies 3, respectively, supporting the roller bodies 3 in a fixed manner. For example, the outer peripheral surfaces of the rotary axes 2 may be fixed to the respective inner peripheral surface of the roller bodies 3 using an adhesive, or alternatively, by forming the external diameter of the rotary axes 2 larger than internal diameter of the roller bodies 3, and pressing the rotary axes 2 inside of the roller bodies 3, respectively, the roller bodies 3 may be supported in a fixed manner by the respective rotary axes 2 due to elastic force of the roller bodies 3. Further alternatively, when manufacturing the roller body 3, the roller body 3 may be fixed or supported by the rotary axis 2 by using a core rod 29 shown in FIG. 7 instead of the rotary axis 2. In this case, the sponge roller 1 (roller body 3), after a reaction, is removed from a mold 21 as is in a state attached to the rotary axis 2 and then rinsed. Through such fixed support, the roller body 3 is rotated along with the rotary axis 2.

As shown in FIG. 3, the top outer surface 5a of the protrusion 5 is a curved surface where the front side of the protrusion 5 (sponge roller 1) in the rotative direction 7 is slanting toward the outer peripheral surface 3a of the roller body 3. Distance h between the highest edge (outer edge) and the lowest edge (upper edge of the outer peripheral surface 5b of the protrusion 5) of the top outer surface 5a is preferably 0.2 mm or greater. Note that the top outer surface 5a in this embodiment is formed to be a curved surface where the front and rear sides of the protrusion 5 in the rotative direction are slanting symmetrically toward the outer peripheral surface 3a of the roller body 3 such that scrub cleaning may be carried out under the same conditions even if the sponge rollers 1 are reversed.

Distance D of the protrusion 5 is set greater than distance H (distance from the outer peripheral surface 3a of the roller body 3 to the highest edge of the top outer surface 5a) of the protrusion 5.

The multiple protrusions 5 are arranged in the same array pattern almost across the entire region of the outer peripheral surface 3a of the roller body 3. Number and size of the protrusions 5 are set such that total area of the top outer surfaces 5a of all of the protrusions 5 is 50% or less than area of a phantom contact outer periphery surface (periphery surface defined by a rotary trajectory 9 of the top outer surface 5a of the protrusion 5 as shown in FIG. 5) passing over the outer edge of the top outer surface 5a of the respective protrusions 5. Moreover, in the case where the surface to be cleaned 10a is a 300 mm-wide wafer, number of protrusions is preferably 100 or greater.

The top outer surface 5a of the protrusion 5 is an interior exposed surface exposing the inner structure of the protrusion 5. The open area ratio of the top outer surface 5a is 50% or greater, preferably 60% or greater. Meanwhile, the outer peripheral surface 3a of the roller body 3 and the outer peripheral surface 5b of the protrusion 5 are each covered by an outer skin layer 4 with a lower porosity than inner structures of the roller body 3 and the protrusion 5. The open area ratio of the surface of the outer skin layer 4 is lower than that of the top outer surface 5a of the protrusion 5, for example 20% or less.

Here, open area ratio of the top outer surface 5a is a value calculated within a predetermined region of the top outer surface 5a by dividing total area of all air holes formed in the top outer surface 5a by area of the predetermined region of the top outer surface 5a and multiplying the result by 100, and open area ratio of the outer peripheral surfaces 3a and 5b is a value calculated within a predetermined region of the outer peripheral surfaces 3a and 5b by dividing total area of all air holes formed in the outer peripheral surfaces 3a and 5b by area of the predetermined region of the outer peripheral surfaces 3a and 5b and multiplying the result by 100. Respective open area ratios may be found through the following measuring method, for example.

The surface (the top outer surface 5a and the outer peripheral surfaces 3a and 5b) of the sponge roller 1 is photographed (magnification: 100 times) using an electronic microscope, and the photographed picture is then doubled in size (total 200 times). A transparent sheet partitioned into a predetermined number of divisions (5-mm squares) by multiple horizontal and vertical border lines is then placed on the photographed picture enlarged 200 times. The photographed picture is visually observed from above the transparent sheet so as to determine whether or not the area of opening portions (air hole portions) is at least half of the entire area of each division, where each division in which the area of the opening portions is at least half of the entire area is regarded as an opening region, and number of those divisions is counted. The number of divisions regarded as the opening regions is divided by the total number of divisions, and the result is then multiplied by 100 to calculate the open area ratio.

The sponge roller 1 made of a PVAt porous material is produced by making an aqueous solution from one type or mixture of polyvinyl alcohol (raw material) having an average degree of polymerization of 500 to 3000 and a saponification degree of 80% or greater, for example, adding to this aqueous solution an aldehyde as a cross-linker, a mineral acid as a catalyzer, and amylum as an air hole forming material, injecting the resulting compound liquid into a predetermined mold 21 shown in FIG. 7 and FIG. 8, letting them react with each other at 40 to 80 degrees C., removing them from the mold 21, and removing the air hole forming material and the like by rinsing in water.

The mold 21 has an outer mold 23, an inner mold 25, a bottom plate 27, the core rod 29, and a cap 31. The outer mold 23 and the inner mold 25 are both formed in a cylindrical shape. The inner mold 25 has an outer diameter equal to or slightly smaller than the inner diameter of the outer mold 23, and is inserted into the outer mold 23. The core rod 29 is inserted almost in the center of the inner mold 25. The bottom plate 27 closes the bottom ends of the outer mold 23 and the inner mold 25, and supports the bottom end of the core rod 29. The cap 31 is joined to the inner peripheral surface at the upper edge of the outer mold 23. The core rod 29 is positioned according to the bottom plate 27 and the cap 31.

Approximately cylindrical open spaces 33, which are for forming the roller bodies 3, are partitioned off between the inner peripheral surface of the inner mold 25 and the outer peripheral surface of the core rod 29. Multiple through-holes 35 for forming the protrusions 5 are formed in the inner mold 25, and the respective through-holes 35 connect to the open spaces 33 via connecting spaces 37. The compound liquid is injected into the open spaces 33 from a casting nozzle 45 that is inserted between the outer mold 23 and the cap 31, flowing into the through-holes 35 from the open spaces 33 via connecting spaces 37. Simultaneously, air within the through-holes 35 is moved to the open spaces 33 and then discharged to the air from the upper end of the open spaces 33. Accordingly, the compound liquid is filled surely to the ends of the through-holes 35.

Here, a membrane-like structure (the outer skin layer 4) having an aperture exists on the outer surface (contact surface with the mold 21) of the sponge roller 1 after it is removed from the mold 21. The outer skin layer 4 has a lower porosity and smaller average air hole diameter than in the internal structure of the sponge roller 1. Moreover, the surface of the outer skin layer 4 has a lower porosity and smaller average opening diameter than the interior exposed surface exposing the internal structure of the sponge roller 1.

In this embodiment, once the sponge roller 1 is removed from the mold 21 and rinsed with water, a rotating pivot (not illustrated in the drawings) is inserted inside each of the roller bodies 3, the sponge roller 1 is supported in a fixed manner by the rotating pivot, and while the sponge roller 1 is rotated by rotating and driving the rotating pivot, a cutting tool is pressed against the outer skin layer 4 that covers the top outer surfaces 5a of the protrusions 5 so as to remove the outer skin layer 4 from the top outer surfaces 5a. Afterward, through such post processing, the internal structure of the sponge roller 1 (the protrusions 5) is exposed at the top outer surfaces 5a of the protrusions 5, making an open area ratio of 50% or greater. Moreover, the average opening diameter of the top outer surfaces 5a is greater than average opening diameter of the outer surface of the outer skin layer 4. On the other hand, since each of the outer peripheral surfaces 3a of the roller bodies 3 and the outer peripheral surfaces 5b of the protrusions 5 is covered by the outer skin layer 4, the open area ratio is maintained lower than open area ratio of the top outer surfaces 5a, and the average opening diameter of the air holes is also maintained smaller than average opening diameter of the top outer surfaces 5a. Furthermore, the top outer surfaces 5a is formed into the aforementioned curved surface through the post processing. Note that the aforementioned post processing may be carried out with the sponge roller 1 in either a wet condition or a dry condition.

Figure 9:
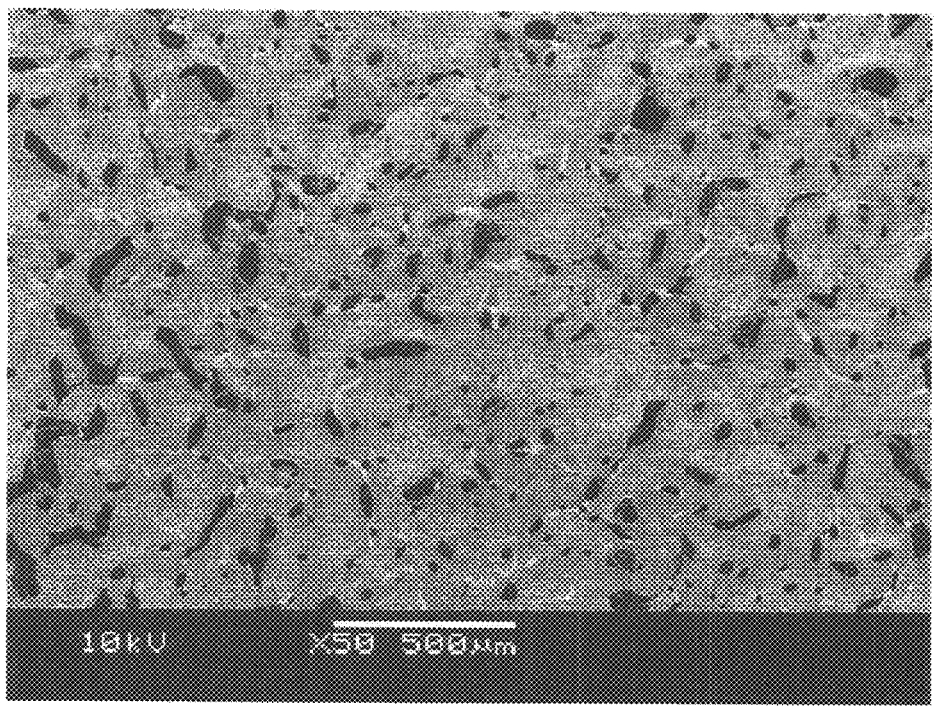
FIG. 9 is an electron micrograph of the outer peripheral surface of a roller body covered by an outer skin layer.
Figure 10:
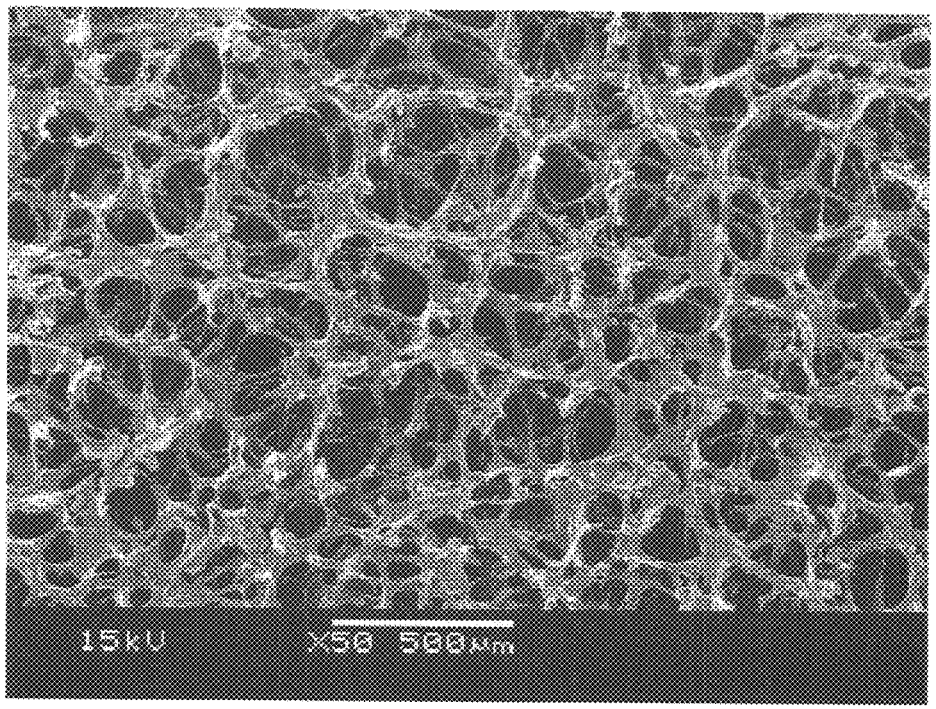
FIG. 10 is an electron micrograph of the top outer surface of a protrusion from which the outer skin layer is removed.

FIG. 9 is an electron micrograph of the outer peripheral surface 3a covered by the outer skin layer 4, and FIG. 10 is an electron micrograph of the top outer surface 5a from which the outer skin layer 4 is removed. Comparing these micrographs, it can be seen that the region of the PVAt material partitioning air holes (openings) is remarkably extensive in the outer peripheral surface 3a (FIG. 9) than in the top outer surface 5a (FIG. 10). Namely, the open area ratio of the top outer surface 5a is remarkably higher than that of the outer peripheral surface 3a, and the average opening diameter thereof is also large.

Note that while the internal structure of the sponge roller 1 has been exposed at the top outer surfaces 5a through the aforementioned post processing in this embodiment, instead of carrying out the aforementioned post processing, the material itself of the outer mold 23 may be selected and/or surface finishing may be carried out on the inner peripheral surface of the outer mold 23 such that the inner peripheral surface of the outer mold 23, which molds the top outer surface 5a when forming the sponge roller 1, has a property that makes it difficult to form the outer skin layer 4. Moreover, while the internal structure has been exposed only at the top outer surfaces 5a of the protrusions 5 in this embodiment, the internal structure may also be exposed at the outer peripheral surfaces 5b of the protrusions 5 or at the outer peripheral surfaces 3a of the roller bodies 3.

Figure 11:
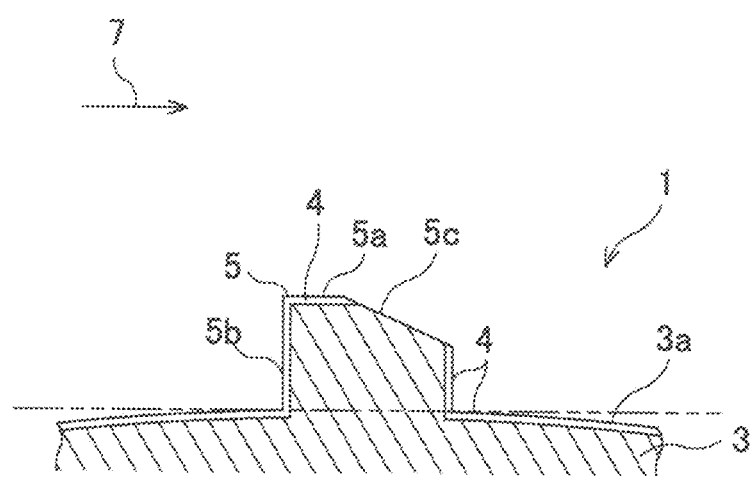
FIG. 11 is an enlarged cross-sectional view illustrative of another aspect of a protrusion.

Furthermore, while the entire region of the top outer surfaces 5a of the protrusions 5 has been determined as the interior exposed surface in this embodiment, the present invention is not limited thereto. For example, as shown in FIG. 11, an interior exposed surface may be provided on the top of the protrusions 5 by partially removing the tops of the protrusions 5 in an oblique direction toward a lower part of the front of the rotative direction (direction of arrow 7) from an intermediate position on the top upper surfaces 5a of the protrusions to form an inclined plane 5c as the interior exposed surface.

Yet further, 30% compressive stress (property value) of the sponge roller 1 in a proper moist state is preferably no less than 2 kPa and no greater than 20 kPa. Proper moist state indicates a moist state in which the PVAt porous material achieves an appropriate elasticity, and moisture content (percentage in weight in moist state relative to dry state) is between approximately 100% and 1500%. Moreover, 30% compressive stress is calculated by cutting the PVAt porous material in the proper moist state such that distance (height in a longitudinal direction) between both ends is 30 mm, setting it on a digital load measuring instrument so that a load is applied across the entire end, measuring load when pressing down by 30% (9 mm) in the longitudinal direction, and dividing the measure load by the area of the end.

The PVAt porous material preferably has a porosity of the internal structure of 80% or greater and 95% or less, and an average air hole diameter of 50 μm or greater and 200 μm or less.

This is because if the porosity is under 80%, flexibility when wet is insufficient, and if the porosity is greater than 95%, it lacks in practical strength, and is thus unsuited for cleaning use in either way. Moreover, this is because if the average air hole diameter is smaller than 50 μm, elasticity when wet is inadequate and sufficient brushing effect cannot be achieved; if it exceeds 200 μm, the holes are too large and are inappropriate for precision cleaning.

The aforementioned porosity is a value calculated by measuring a rectangular parallelepiped PVAt porous material in a dry state, which is sufficiently dried using a dryer, using a dry-type automatic densimeter and calculating the following equation (1) from apparent volume and absolute volume of the rectangular parallelepiped.

$$\text{Porosity}(\%) = (\text{apparent volume} - \text{absolute volume}) / \text{apparent volume} \times 100 \quad (1)$$

The aforementioned average air hole diameter is an average value of diameters of the multiple air holes formed in the internal structure of the PVAt porous material. In this embodiment, the average of major axes (distance in a longitudinal direction of each of the air holes) of a predetermined number of air holes selected from the multiple air holes according to a predefined standard is defined as the average air hole diameter, which may be found through the following measuring method, for example.

Cut the sponge roller 1 at a predetermined position, and then photograph the internal composition exposed at that cut surface using an electron microscope. Next, set a predetermined measuring range on the photographed picture, and extract twenty air holes from the multiple air holes existing in the measuring range in decreasing order of major axis. Measure the major axes of the respective twenty extracted air holes. Calculate as the average air hole diameter the average of the measured values from the eleventh to the twentieth of the twenty measured values arranged in decreasing order.

Note that even the average opening diameter of the interior exposed surface and the average opening diameter of the surface of the outer skin layer 4 may also be defined in the same way as the aforementioned average air hole diameter. Namely, the average of major axes (distance in a longitudinal direction of each of the openings) of a predetermined number of openings selected from the multiple openings according to a predefined standard is defined as the average opening diameter, which may also be found through the same measuring method as the aforementioned average air hole diameter. In this case, once the surface of the outer skin layer 4 or the interior exposed surface has been photographed using an electron microscope, twenty openings should be extracted from the multiple openings existing in a measuring range of the photographed picture (see FIG. 9 and FIG. 10) in decreasing order of major axis, respective major axes of the twenty extracted openings are measured, and average of the measured values from the eleventh to the twentieth is calculated as average opening diameter.

Moreover, the PVAt porous material preferably has an apparent density of 0.06 g/cm$^3$ or greater, and a water retention value of 600% or greater.

The aforementioned apparent density is found by measuring weight (dry weight) of the PVAt porous material in a predetermined shape (e.g., rectangle) in a dry state and outer dimensions thereof in a proper moist state, calculating volume (wet volume) from the outer dimensions, and dividing the measured dry weight by the calculated wet volume.

Furthermore, the water retention value is found by measuring weight (dry weight) of the PVAt porous material in a dry state and weight (wet weight) thereof in a state containing a sufficient amount of water, and then calculating the following equation (2).

$$\text{Water retention value}(\%) = (\text{wet volume} - \text{dry volume}) / \text{dry volume} \times 100 \quad (2)$$

As described above, according to this embodiment, the top outer surfaces 5a of the protrusions 5 are interior exposed surfaces exposing the internal structure of the protrusions 5 having a higher porosity (open area ratio) than the outer skin layer 4, and these top outer surfaces 5a make contact with the surfaces to be cleaned 10a at the time of cleaning. Therefore, when using the sponge roller 1 first, for the purpose of heightening the cleaning capability of the sponge roller 1 itself (especially area to be in contact with the surfaces to be cleaned 10a of the outer surfaces of the protrusions 5), time (start-up time and break-in time) for scrub cleaning of a dummy surface to be cleaned may be reduced.

Furthermore, even when particles with a smaller diameter than the openings of the top outer surfaces 5a penetrate inside of the protrusions 5 from the openings of the top outer surfaces 5a due to a relatively high open area ratio of the top outer surfaces 5a, those particles may not be easily captured within the protrusions 5, thereby improving the life cycle of products.

In addition, the top outer surfaces 5a have a relatively high open area ratio, and the material (polyvinyl acetal porous material) of the sponge roller 1 has a low abundance ratio (area ratio). Therefore, particles with a relatively large diameter are not easily captured while cleaning, and damage to the surfaces to be cleaned 10a by the captured particles may be inhibited.

Moreover, since the outer peripheral surfaces 3a of the roller bodies 3 and the outer peripheral surfaces 5b of the protrusions 5 are each covered by the outer skin layer 4 with a low open area ratio, it is easy for the cleaning liquid flowing from inside of the sponge roller 1 outward to flow out from the top outer surfaces 5a of the protrusions 5 than from the outer peripheral surfaces 3a of the roller body 3 and the outer peripheral surfaces 5b of the protrusions. As a result, reduction in break-in time, improvement in life cycle of products, and control of damage to a surface to be cleaned may be further achieved.

Furthermore, since the top outer surfaces 5a are slanting, on the front side of the protrusions 5 in the rotative direction, toward the outer peripheral surfaces 3a of the roller bodies 3, it is easy for the top outer surfaces 5a to make contact with the surfaces to be cleaned 10a while scrub cleaning. As a result, reduction in break-in time, improvement in life cycle of products, and control of damage to a surface to be cleaned may be further achieved.

Note that the present invention is not limited to the above-given embodiment and modifications thereof described merely as an example, and aside from the above embodiment and the like, various changes in accordance with design may be made without departing from the technical spirit or scope of the present invention.

INDUSTRIAL APPLICABILITY

The cleaning sponge roller according to the present invention may be suitable for use mainly in scrub cleaning in a cleaning step of an electronics components manufacturing process.

DESCRIPTION OF REFERENCE NUMERALS

1 . . . sponge roller, 2 . . . rotary axis, 3 . . . roller body, 3a . . . outer surface, 4 . . . outer skin layer, 5 . . . protrusion, 5a . . . top outer surface (interior exposed surface), 5b . . . outer surface, 5c . . . slanted face (interior exposed surface), 10 . . . object to be cleaned, 10a . . . surface to be cleaned

What is claimed is:

1. A cleaning sponge roller, which is made of a polyvinyl acetal porous material having elasticity in a wet state and comprises a roller body in an approximate cylinder form and a plurality of protrusions formed integrally on an outer peripheral surface of the roller body and rotates the protrusions to make contact with a surface to be cleaned so as to clean the surface; and the outer peripheral surface of the roller body and outer peripheral surfaces of the protrusions are covered by an outer skin layer; and wherein outer surfaces of the protrusions respectively have an interior exposed surface making contact with the surface to be cleaned while cleaning in a state where internal structures of the protrusions are exposed.

2. The cleaning sponge roller according to claim 1, wherein open area ratio of the internal exposed surface is 50% or greater.

3. A cleaning sponge roller, which is made of polyvinyl acetal porous material having elasticity in a wet state and comprises a roller body in an approximate cylinder form and a plurality of protrusions formed integrally on an outer peripheral surface of the roller body and rotates the protrusions to make contact with a surface to be cleaned so as to clean the surface wherein outer surfaces of the protrusions respectively have an interior exposed surface making contact with the surface to be cleaned while cleaning in a state where internal structures of the protrusions are exposed, an outer peripheral surface of the roller body is covered by an outer skin layer with a lower open area ratio than that of the interior exposed surface, outer peripheral surfaces of the protrusions are covered by an outer skin layer with a lower open area ratio than that of the interior exposed surface, and the outer skin layer of the protrusion continues from the outer skin layer of the roller body.

4. The cleaning sponge roller according to claim 2, wherein an outer peripheral surface of the roller body is covered by an outer skin layer with a lower open area ratio than that of the interior exposed surface.

5. The cleaning sponge roller according to claim 2, wherein outer peripheral surfaces of the protrusions are covered by an outer skin layer with a lower open area ratio than that of the interior exposed surface.

6. The cleaning sponge roller according to claim 2, wherein the interior exposed surface on the front side of the protrusions in the rotative direction slants toward the outer peripheral surface of the roller body.

7. The cleaning sponge roller according to claim 2, wherein the interior exposed surface is the top outer surface of the protrusions.

8. The cleaning sponge roller according to claim 1, wherein an outer peripheral surface of the roller body is covered by an outer skin layer with a lower open area ratio than that of the interior exposed surface.

9. The cleaning sponge roller according to claim 1, wherein outer peripheral surfaces of the protrusions are covered by an outer skin layer with a lower open area ratio than that of the interior exposed surface.

10. The cleaning sponge roller according to claim 1, wherein the interior exposed surface on the front side of the protrusions in the rotative direction slants toward the outer peripheral surface of the roller body.

11. The cleaning sponge roller according to claim 1, wherein the interior exposed surface is the top outer surface of the protrusions.

* * * * *